United States Patent [19]

Lee

[11] Patent Number: 5,164,805
[45] Date of Patent: Nov. 17, 1992

[54] NEAR-INTRINSIC THIN-FILM SOI FETS

[75] Inventor: Chun-Teh Lee, Bedford, Mass.

[73] Assignee: Massachusetts Institute of Technology, Cambridge, Mass.

[21] Appl. No.: 385,980

[22] Filed: Jul. 26, 1989

Related U.S. Application Data

[63] Continuation of Ser. No. 235,024, Aug. 22, 1988, abandoned.

[51] Int. Cl.[5] .................... H01L 27/12; H01L 29/78; H01L 29/62
[52] U.S. Cl. ................................ 257/351; 257/407; 257/402
[58] Field of Search ...................... 357/4, 23.7, 67, 59, 357/42, 23.3

[56] References Cited

U.S. PATENT DOCUMENTS

| 3,660,732 | 5/1972 | Allison | 357/23.7 |
| 4,746,628 | 5/1988 | Takafuji et al. | 357/4 |
| 4,748,485 | 5/1988 | Vasudev | 357/23.7 |
| 4,841,346 | 6/1989 | Noguchi | 357/23.3 |

FOREIGN PATENT DOCUMENTS

| 0024905 | 3/1981 | European Pat. Off. | 357/23.12 |
| 0063915 | 11/1982 | European Pat. Off. | 357/23.7 |
| 0197531 | 10/1986 | European Pat. Off. | 357/23.7 |
| 61-145869 | 7/1986 | Japan | 357/4 |

OTHER PUBLICATIONS

*IEEE Trans. Electron Devices*, Ed-31; No. 4; by Baccarani et al.; Apr. 1984; pp 452–462.
*Tech. Digest, Intern'l Electron Device Meeting*; by Rung et al.; 1982; pp. 237–240.
*Tech. Digest, Intern'l Electron Device Meeting*; by Borland; 1987; pp. 12–15.
*IEEE Trans. Electron Devices*, ED-26; No. 4; by Troutman; Apr. 1979; pp. 461–469.
*Tech. Digest, Intern'l Electron Device Meeting*; by Malhi et al. 1982; pp. 107–110.
*IEEE Electron Device Letters*, EDL-7; No. 4, by Colinge; Apr. 1986; pp. 244–246.
*IEEE Electron Device Letters*, EDL-9; No. 2; by Colinge; Feb. 1988; pp. 97–99.
*Tech. Digest, Intern'l Electron Device Meeting*; by Yoshimi et al.; 1987; pp. 640–643.
*IEEE Trans. Electron Devices*, ED-30, No. 10; by Lim et al; Oct. 1983; pp. 1244–1251.
*IEEE Trans. Electron Devices*, ED-31, No. 4,; by Lim et al.; Apr. 1984; pp. 401–408.

Primary Examiner—Jerome Jackson, Jr.
Attorney, Agent, or Firm—Hamilton, Brook, Smith & Reynolds

[57] ABSTRACT

A submicrometer, near-intrinsic, thin-film, SOI complementary filed effect transistor structure is disclosed. The device is characterized by having a gate comprising material having a work function which approximates its Fermi level to the middle of the band gap of the channel material. Such devices display desirable transconductance, subthreshold slope and punch-through resistance.

40 Claims, 16 Drawing Sheets

NEAR-INTRINSIC THIN-FILM SOI FETS

The Government has rights in this invention pursuant to Grant Number F19628-85-C-0002 awarded by the Air Force.

This is a continuation of co-pending application Ser. No. 07/235,024, filed on Aug. 22, 1988, now abandoned.

BACKGROUND OF THE INVENTION

Bulk silicon metal oxide semiconductor field effect transistors (MOSFET's) are known to experience problems such as punch-through and latch-up as the device dimensions approach the submicrometer range. Punch-through is an effect found in devices having a short channel length or low channel doping in which, at a sufficient drain voltage, the drain electric field penetrates the source region, thereby effectively forming a current (leakage) path. Latch-up is an effect in complementary MOSFET (CMOS) circuits through which high excess current is generated by positive feedback between coupled parasitic bipolar transistors present in the device. The occurrence of latch-up can permanently damage the circuit or temporarily cause circuit malfunction because of the generation of abnormally large current flow.

Conventionally, attempts have been made to avoid punch-through by increasing substrate doping concentration, using a lightly doped drain-structure and reducing power supply voltage and junction depth (as described by G. Baccarani et al, *IEEE Trans. Electron Devices*, ED-31, 452 (1981), for example). The first three attempts, however, have resulted in degradation of device characteristics below the threshold voltage as well as degradation of substrate bias sensitivity and transconductance. Attempts to suppress latch-up have traditionally involved the use of a thin, lightly doped epilayer on a heavily doped substrate. Alternatively, latch-up suppression has been attempted using trench isolation or selective epitaxial growth. These approaches were described, for example, by D. B. Estreich in *Stanford Electronics Lab., Tech. Report* G-201-9, Stanford Univ., Calif. (1980); by R. D. Rung et al. in *Tech. Digest, Intern'l Electron Device Meeting*, p. 237 (1982); and by J. 0. Borland in *Tech. Digest, Intern'l Electron Device Meeting*, p. 12 (1987). Unfortunately, the thickness of lightly doped epilayers is limited by the out-diffusion of dopants from the heavily doped substrate, and trench isolation and selective epitaxial growth greatly increase process complexity and cost.

Further shrinkage in device dimensions is expected to require a reduction in power supply voltage. As this occurs, the device threshold voltage must be scaled accordingly in order to maintain the desired gain in current driving capability. Reductions in threshold voltage, however, are known to result in increases in the off state leakage current.

Silicon-on-insulator (SOI) structures are known to offer many advantages over their bulk silicon counterparts. These include the absence of latch-up, low parasitic capacitance, high packing density and process simplicity. It has been recently reported that the floating body effect can be eliminated and desirable device characteristics, (including steep subthreshold slope, high punch-through resistance, reduction of hot-carrier degradation, high mobility, and high transconductance) can be obtained in fully depleted thin film SOI MOSFET's. See, for example, S. D. S. Malhi et al, *Tech. Digest, Intern'l Electron Device Meeting*, p. 107 (1982); J.-P. Colinge, *IEEE Electron Device Lett.*, EDL-7, 244 (1986); J.-P. Colinge, *IEEE Electron Device Lett.*, EDL-9, 97 (1988); and M. Yoshimi et al., *Tech. Digest, Intern'l Electron Device Meeting*, p. 640 (1987).

A near-intrinsic thin-film SOI complementary MOSFET having a p+ polysilicon gate in n-channel devices and an n+ polysilicon gate in p-channel devices has been suggested in order to obtain enhancement mode operation (see Malhi et al., above). Simulations of these devices, however, indicate that the threshold voltages of these devices are about 0.92 V for n-channel devices and −0.92 V for p-channel devices. Such values are too high to be used effectively in submicrometer devices, especially when using scaled power supply voltages.

SUMMARY OF THE INVENTION

This invention pertains to a new class of submicrometer, near-intrinsic, thin-film FET's. These devices are characterized by having a gate material which has a work function which approximates its Fermi level to the middle of the band gap of the thin-film material.

In one embodiment, the devices of the invention comprise a conducting or semiconducting substrate upon which is formed an insulating layer. A semiconductor thin film is formed upon the insulating layer thereby burying the insulator. Alternatively, the buried insulator and semiconductor thin film can be produced by ion implantation of appropriate impurities into the semiconductor substrate followed by thermal anneals. Epitaxial growth on the semiconductor film can be applied if necessary to form a substantially single crystal layer on the substrate. The semiconductor contains regions of near-intrinsic impurity concentration which define device channel regions. Additionally, the thin film contains areas of higher impurity concentration which define source and drain regions. The film in the channel regions has a thickness of less than about 0.5 um and an impurity concentration of below about $10^{16}$ cm$^{-3}$. A gate dielectric is formed upon the channel regions and a gate material is formed upon the gate dielectric. The gate material is selected to have a work function which approximates its Fermi level to the middle of the band gap of the semiconductor thin film. By employing a conducting or semiconducting substrate, the device can be back-gate biased.

In another embodiment, the substrate has been eliminated or replaced by an insulating material. In devices of this type, back-gate biasing is not possible.

Simulations of devices of the invention have shown significantly higher transconductance and punch-through voltage, and significantly steeper subthreshold slopes when compared to their bulk silicon counterparts. These devices also exhibit threshold voltages which are well suited for submicron geometry. Additionally, as both n-type and p-type semiconducting films result in approximately the same device threshold voltages when in the near-intrinsic state and fully depleted condition, the need to match channel doping to source and drain doping is eliminated. As such, both n-type and p-type insulated gate devices can be operated with near-intrinsic channels, regardless of the doping variety. This enhances the device manufacturing process as it eliminates a channel doping step. Finally, the ability to back-gate bias the devices having conducting and semiconducting substrates allows them to be easily fine tuned. As such, devices of this type are expected to be highly desirable for complementary circuitry in a wide variety of applications.

DETAILED DESCRIPTION OF THE INVENTION

Figure 1:
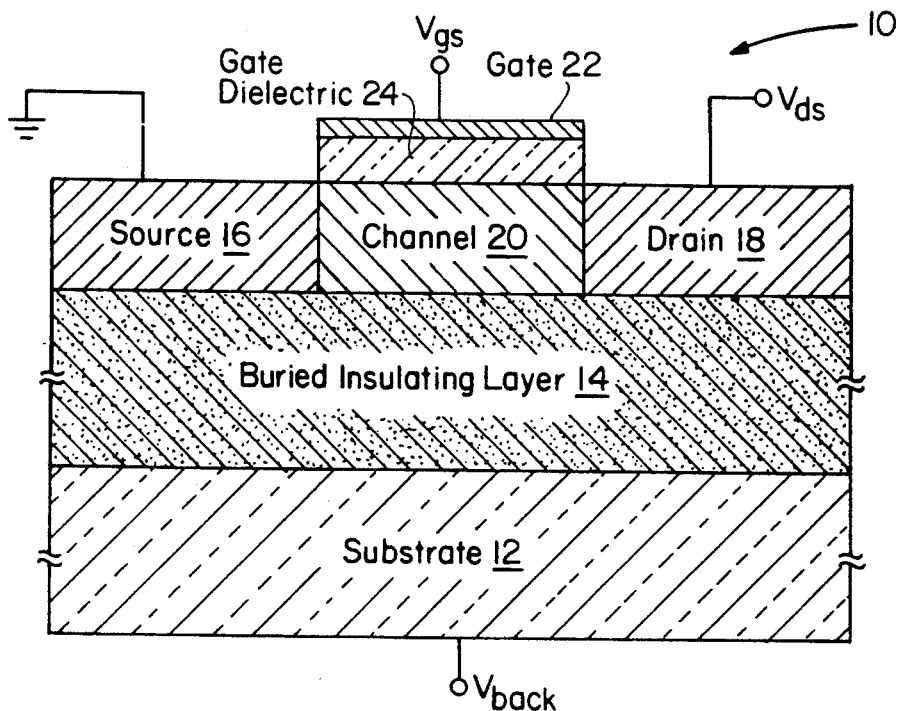
FIG. 1 is a cross sectional view of a representative device of this invention.

The present invention is a near-intrinsic, thin-film, semiconductor-on-insulator (SOI) complementary insulated gate, field effect transistor (FET) which uses a gate material having a work function which approximates its Fermi level to the middle of the band gap of the semiconductor material. The FET described herein has utility in a wide variety of circuits and is particularly well suited for very large scale integrated circuit (VLSI) and ultra large scale integrated circuit (ULSI) applications.

In one embodiment, the invention is a device which comprises a gate electrode, a thin gate insulator and a thin silicon film on a buried insulating layer which is supported by a conducting or semiconducting substrate. Alternatively, the gate electrode, gate insulator and thin silicon film can be supported directly by an insulating substrate. The material of the gate electrode has a work function which places its Fermi level close to the middle of the silicon band gap thereby resulting in a desirable threshold voltage for submicrometer devices. Materials having work functions between about 4.4 and 5.0 eV are preferred, provided they are also highly conductive, have good processability and are physically and chemically compatible with the other materials of the device. A variety of low resistance refractory metals and silicides thereof meet these requirements. In the preferred embodiment, the gate material is tungsten (work function: 4.63 eV), molybdenum (4.53 eV), tungsten silicide (4.7 eV) or molybdenum silicide (4.7 eV). Each of the work function values given above is accurate to within about 0.1 eV.

The thin silicon film contains zones which define source regions, drain regions and channel regions. As prepared, the silicon film is intrinsic or near-intrinsic (i.e., dopant concentration is less than $10^{16}$ cm$^{-3}$). The channel regions, defined as those upon which the gate is deposited, retain the intrinsic or near-intrinsic silicon state. The source and drain regions, however, are subsequently subjected to heavy doping.

In the case in which the source and drain regions contain n-type doping, the device is referred to as an NFET. In the case in which the source and drain regions contain p-type doping the device is referred to a PFET.

The use of intrinsic or near-intrinsic silicon film results in enhanced device performance because it provides for a fully depleted conduction channel, the absence of space charges, and high carrier mobilities. Additionally, as both n-type and p-type near-intrinsic films result in similar device threshold voltages, it is not necessary to match the channel doping type to the source/drain doping type.

The enhanced performance of devices having near-intrinsic semiconducting channels is explained as follows. The thin-film insulated gate FET has a normal front gate on the top and a buried insulating layer which separates a thin semiconducting film (conduction channel) from a conducting or semiconducting substrate (back gate). The near-intrinsic films of these devices are thin enough that complete depletion occurs at the threshold condition under proper back-gate biases. Assuming that a critical surface electron concentration $n_T$ is required to reach the threshold condition, the front-surface potential $\psi_{sf}$ at the threshold condition can be approximated as:

$$\psi_{sf} = \phi_B + \psi_0 \qquad (1)$$

where $\phi_B$ is the Fermi potential of the thin semiconducting film and where $\psi_0 = \phi_B$ if $N_A > n_T$ or $\psi_0 = \dfrac{kT}{q} \ln\left(\dfrac{n_T}{n_i}\right)$ if $N_A \leq n_T$, $-q$ is the electron charge, $N_A$ is the channel doping concentration, $n_i$ is the intrinsic carrier concentration, k is the Boltzmann constant, and T is the temperature. Using the analysis described by Lim and Fossum in *IEEE Trans. Electron Devices*, ED-30, 1244 (1983), the back-surface potential $\omega_{sb}$ and front-gate threshold voltage $V_{Tf}$ can be expressed as:

$$\psi_{sb} = \frac{C_b}{C_b + C_{ob} + C_{sb}} \left\{ \psi_{sf} - \frac{1}{C_b} \left[ \frac{qN_A t_b}{2} + C_{ob}(V_{FBb} - V_{back}) \right] \right\} \quad (2)$$

and $$V_{Tf} = V_{FBf} + \frac{1}{C_{of}(C_b + C_{ob} + C_{sb})} [A_1(\theta_B + \psi_0) + A_2 N_A t_b - C_b C_{ob}(V_{back} - V_{FBb})] \quad (3)$$

where $A_1=(C_b+C_{of})(C_b+C_{ob}+C_{sb})-C^2_b$, $A_2=q(2C_b+C_{ob}+C_{sb})/2$, $t_b$ is the Si-film thickness, $V_{back}$ is the back gate bias, $V_{FBf}=\Phi_{msf}-Q_{ff}/C_{of}$ and $V_{FBb}=\Phi_{msb}-Q_{fb}/C_{ob}$ are the front- and back-gate flatband voltages, $\Phi_{msf}$ and $_{101\ msb}$ are the front and back gate-body work-function differences, $Q_{ff}$ and $Q_{fb}$ are the fixed interfacial charges at the front and back Si-SiO$_2$ interfaces, $C_{of}$ and $C_{ob}$ are the front- and buried-oxide capacitances, $C_b=\epsilon_s/t_b$ is the depletion capacitance, $\epsilon_s$ is the Si-film dielectric constant, $C_{sf}=qN_{sf}$ and $C_{sb}=qN_{sb}$, and $N_{sf}$ and $N_{sb}$ are the front and back interface-state densities. In Eq. 3 $\psi_{sf}=2\psi_B$ used by Lim and Fossum has been replaced with $\psi_{sf}=\phi_B+\psi_O$. Eq. 3 shows a linear dependence of $V_{Tf}$ on $V_{back}$ if back-gate bias does not cause inversion or accumulation of the back surface.

From the analysis described by Lim and Fossum in *IEEE Trans. Electron Devices*, ED-31, 401 (1984), the front-gate linear transconductance is given as:

$$g_{mf} \approx \frac{W}{L} \mu_n C_{of} V_{ds} \quad (4)$$

under the assumptions of a uniform channel doping and a constant carrier mobility, where L is the channel length, W is the channel width, $\mu_n$ is the electron mobility, and $V_{ds}$ is the drain voltage. In Eq. 4 it is assumed that further increase of front-gate voltage $V_{gs}$ after strong inversion at the front surface does not significantly change $\psi_{sf}$ because most of the voltage increment drops across the front-gate oxide. Eq. 4 shows that $g_{mf}$ is independent of Si film thickness and back gate bias.

Although past near-intrinsic, thin-film devices lead to improvement of device parameters such as transconductance, subthreshold slope and off-state leakage current, they have threshold voltages which are too high for use in submicrometer devices. Such threshold voltages can be reduced by using, as a gate material, a material having a work function which approximates its Fermi level to the middle of the semiconductor band gap. Since, in a near-intrinsic semiconductor, the Fermi level of the semiconductor material is at the approximate center of the semiconductor band gap, selection of the proper gate material serves to match the Fermi levels of the semiconductor material and the gate material.

By approximating the gate material Fermi level to the middle of the semiconductor band gap, an optimum threshold voltage for the device is achieved.

For near intrinsic dopant levels (i.e., those below about 10$^{15}$ cm$^{-3}$) the use of either n-type or p-type semiconductor material results in approximately the same device threshold voltages. This is a result of their Fermi levels approximating the middle of the semiconductor band gap in the near-intrinsic state, which implies $\phi_B < \psi_O$. Thus, for both NFETs and PFETs having near-intrinsic channels, the type of channel doping is immaterial. This allows balanced complementary circuits of both NFETs and PFETs in which all devices contain channels having near-intrinsic dopant levels of a single dopant variety. Since at the near-intrinsic state the device threshold voltage is independent of the doping variety, complementary insulated gate FET operation can be achieved with devices having only n-type channel doping, only p-type channel doping or mixtures thereof.

When the device uses a gate material which has a work function that places its Fermi level slightly off of the middle of the semiconductor band gap, low back-gate biases can be used to fine tune the device to further enhance circuit performance. In one embodiment of the invention, the thin-film SOI device comprises a tungsten gate, a 10 nm thick gate oxide, a thin silicon film and a 1 micron thick buried oxide on a silicon substrate. This device has been simulated using a PISCES-IIB device simulator described by Pinto et al, "PISCES-II: Poisson and Continuity Equation Solver", *Stanford Electronics Lab. Tech. Report*, Stanford University, California (September 1984).

A cross sectional view of the simulated device is shown in FIG. 1. In FIG. 1, the device 10, comprises a substrate 12, upon which is formed an insulating layer 14 which is preferably an oxide. The substrate should be thick enough to provide mechanic support for the circuits and the insulating layer can be of any thickness with about 0.1-3 microns preferred.

In the embodiment of FIG. 1, the substrate 12 comprises essentially any conducting, semiconducting or insulating material compatible with semiconductor technology. Conducting and semiconducting materials are preferred, however, as they allow back-gate biasing of the device. Silicon and gallium arsenide are the preferred substrate materials for many applications, however for some applications, insulating substrates such as glass or sapphire are preferred.

In the embodiment presented in FIG. 1, an insulating layer 14 has been formed on the substrate 12. This insulating layer is preferably a silicon oxide, silicon nitride or mixture thereof. In applications in which the substrate 12 is an insulator, however, a separate insulating layer 14 can be used, but is not required.

A thin semiconductor film, preferably silicon or gallium arsenide, is formed upon insulating layer 14 to thereby bury the insulating layer. The thin semiconductor film is divided into three zones which define at least one source region 16, at least one drain region 18, and at least one channel region 20 disposed between the source and drain regions. The thin semiconducting film in the channel region has a thickness of below about 0.5 microns with a thickness of below about 0.25 microns being preferred. The semiconducting film in the source and drain regions can be thicker to aid attachment of contacts. A gate 22, is provided on the channel region 20, the gate being separated from the channel by a gate dielectric 24. In the preferred embodiment, the gate dielectric is about 30-nm thick or less and comprises an oxide or nitride of the channel material. Alternatively, the gate dielectric can comprise a combination of insulating oxides and nitrides. The gate material, as previously described, comprises a material having a work function which approximates its Fermi level to the middle of the band gap of the semiconductor film. In the preferred embodiment the channel length is approximately 1.5 microns or less. Because the source and drain regions are more heavily doped than the channel region, however, the metallurgical channel length is shorter. This results because at the boundary between the channel and the source or drain, the doping concentration falls off from the heavily doped region toward the channel.

The invention has a number of improvements over previously described devices especially in complementary circuit applications. In the discussion below, unless otherwise noted, the channel region is p-type silicon having an impurity concentration of about $10^{14}$ cm$^{-3}$. Such a device is commonly referred to as a MOSFET. Similar to the terminology described previously, devices having n-type source/drain doping are termed NMOSFETs and devices having p-type source/drain doping are termed PMOSFETs. The thin-film SOI device used in the simulation contains a tungsten gate, a 10-nm thick gate oxide, a thin silicon film and a 1-um thick buried oxide on a silicon substrate. The surface mobility was reduced using a reduction factor of 0.75, the mobility was field dependent, the drain voltage, $V_{ds}$, was 0.05 V, and an interface state density of $2 \times 10$ cm$^{-2}$eV$^{-1}$ was assumed. Although the following discussions are focused on n-channel devices similar results are expected for p-channel devices. Additionally, other semiconductor films and insulating materials are expected to exhibit similar results.

Figure 2:
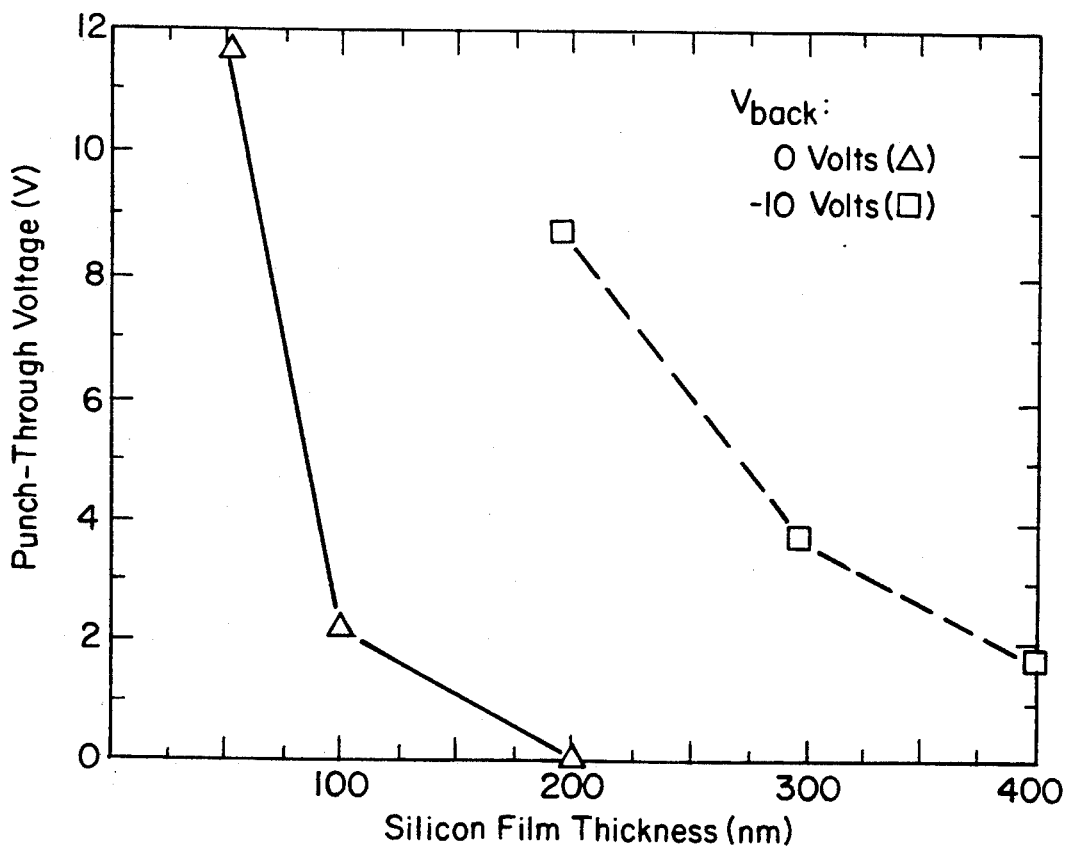
FIG. 2 is a plot of punch-through voltages of NMOS-FETs versus SOI film thickness for devices of the invention at different back-gate biases.
Figure 3A:
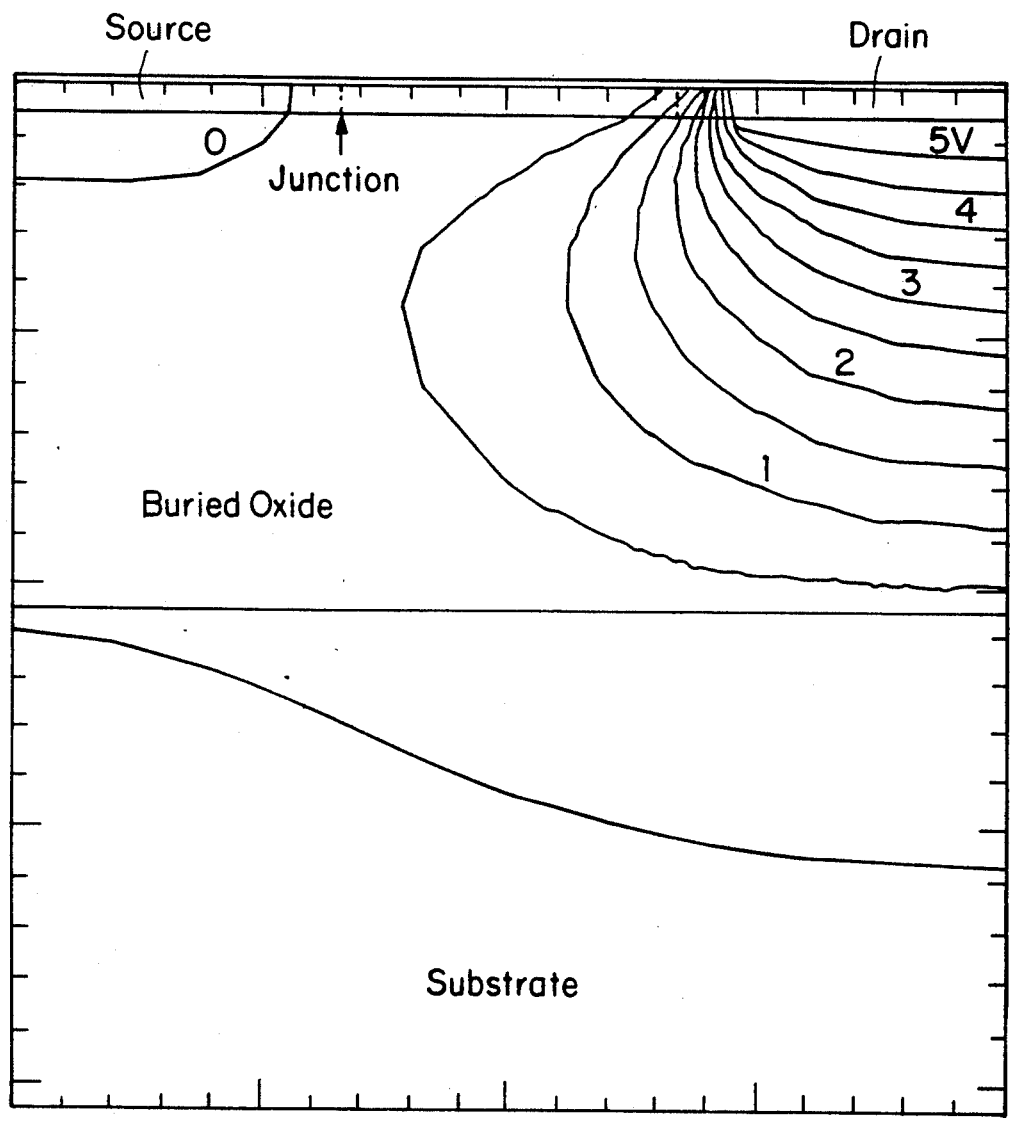
FIG. 3A–3C present potential contours simulated within the SOI MOSFETs of this invention for various film thicknesses and back gate voltages.
Figure 3B:
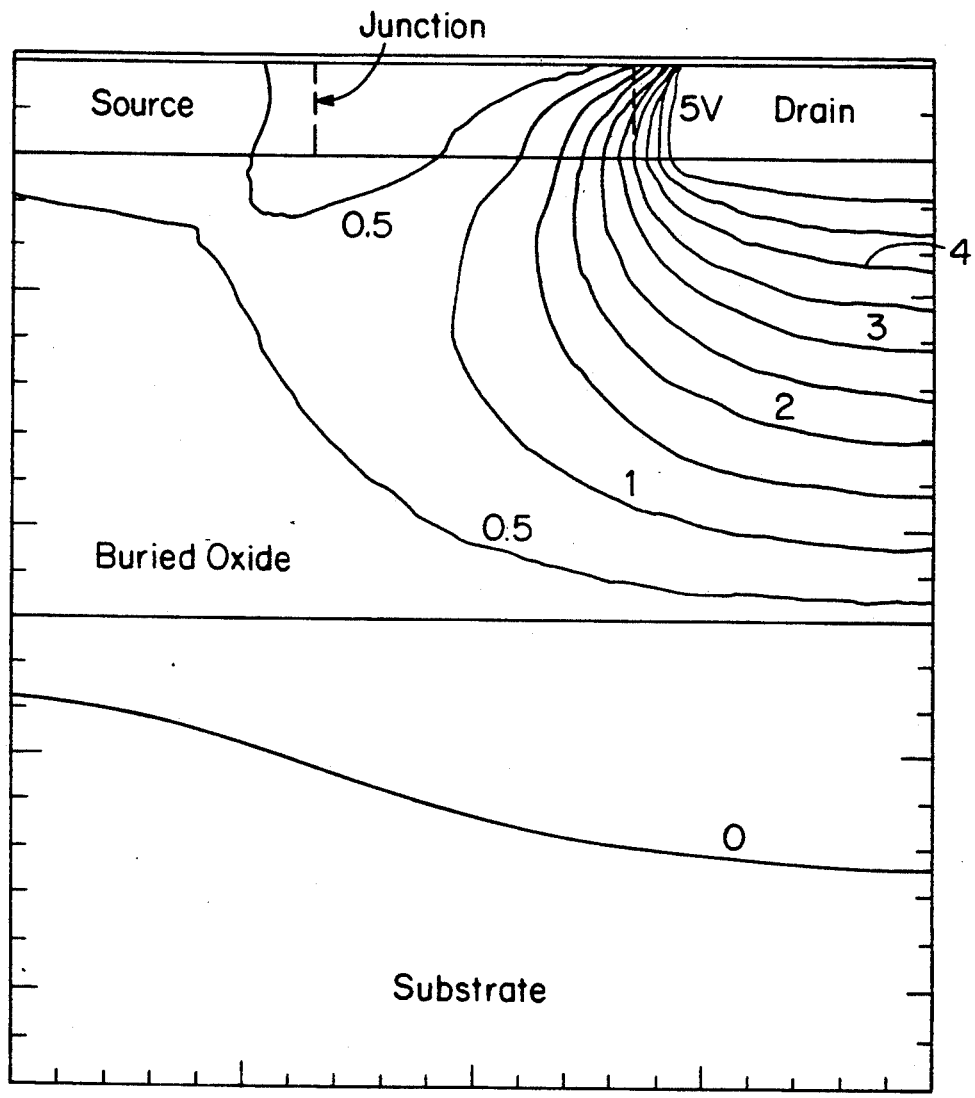
Figure 3C:
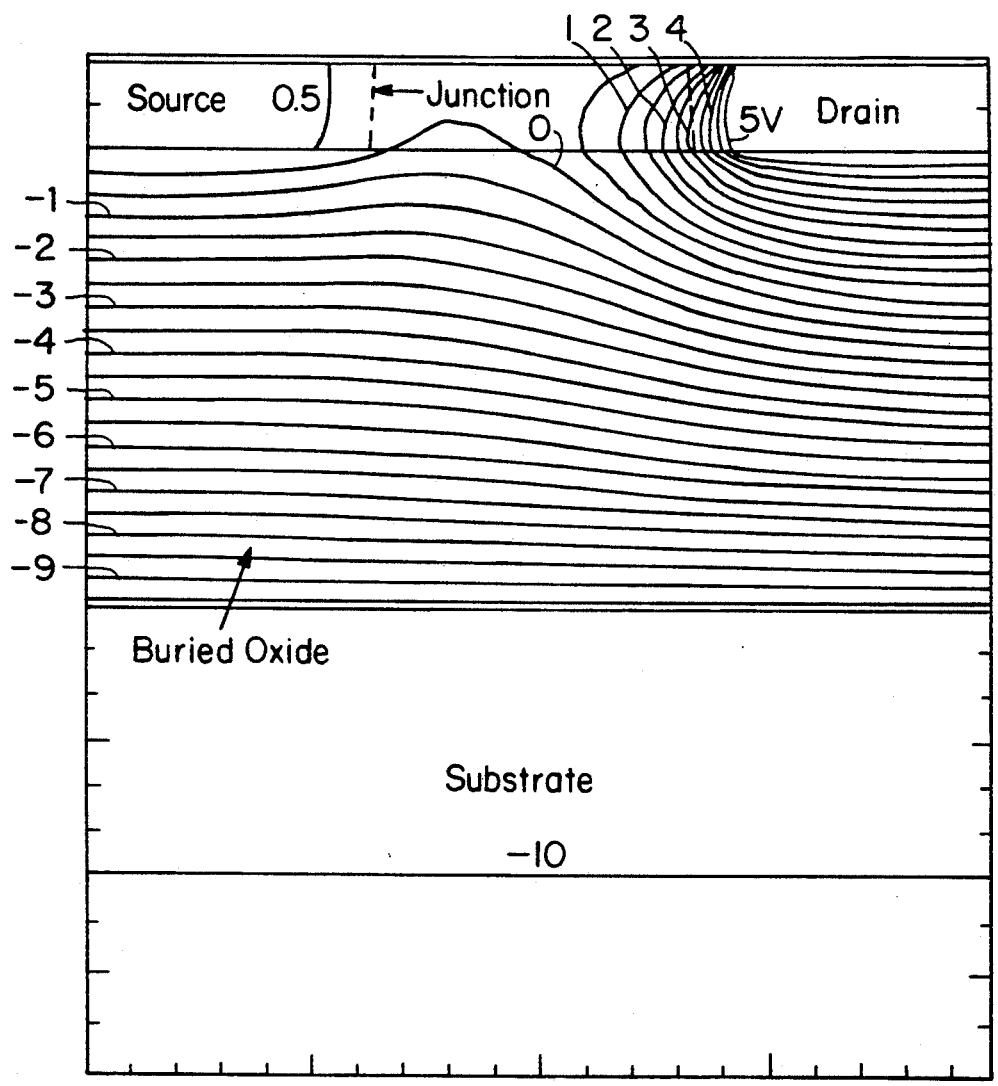
Figure 4:
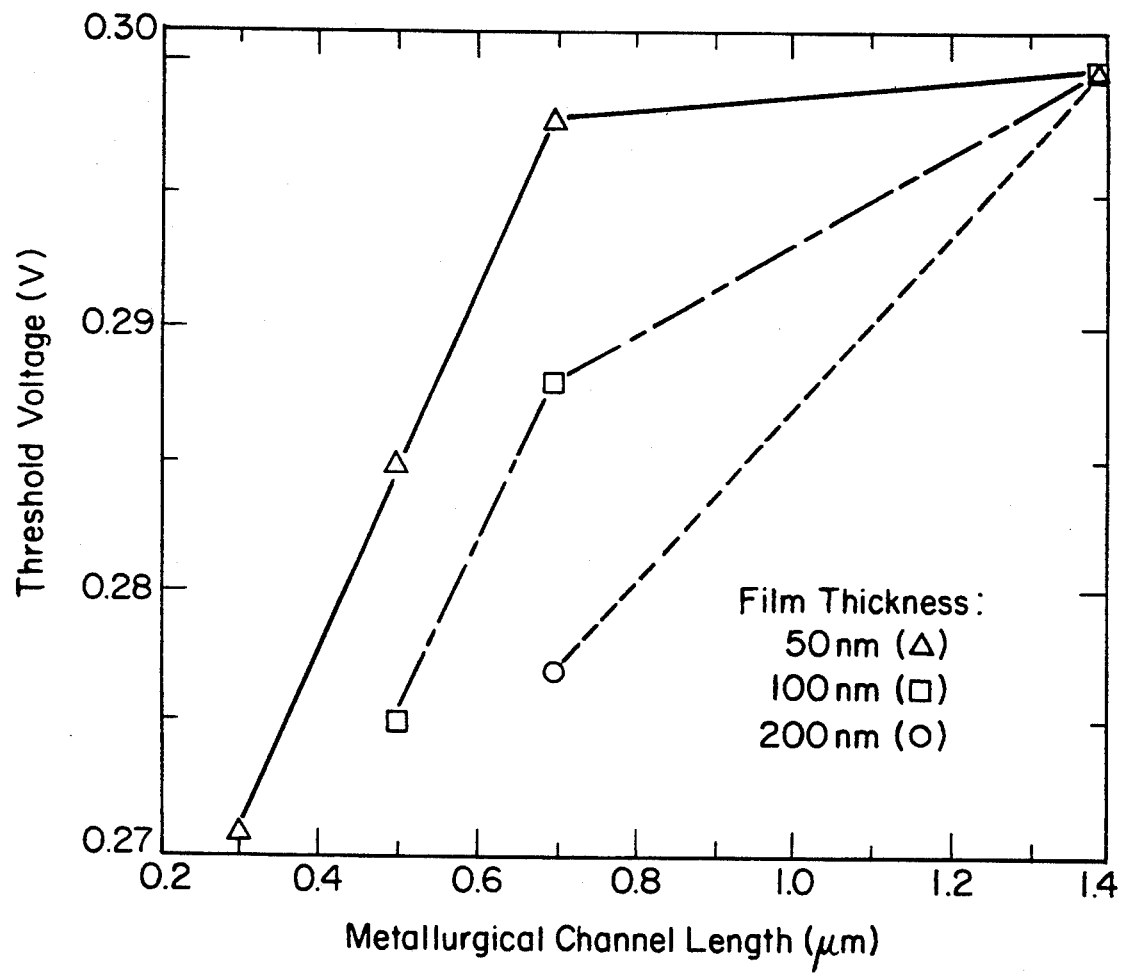
FIG. 4 is a plot of threshold voltage versus metallurgical channel length for SOI MOSFETs having three different thin-film thicknesses.
Figure 5:
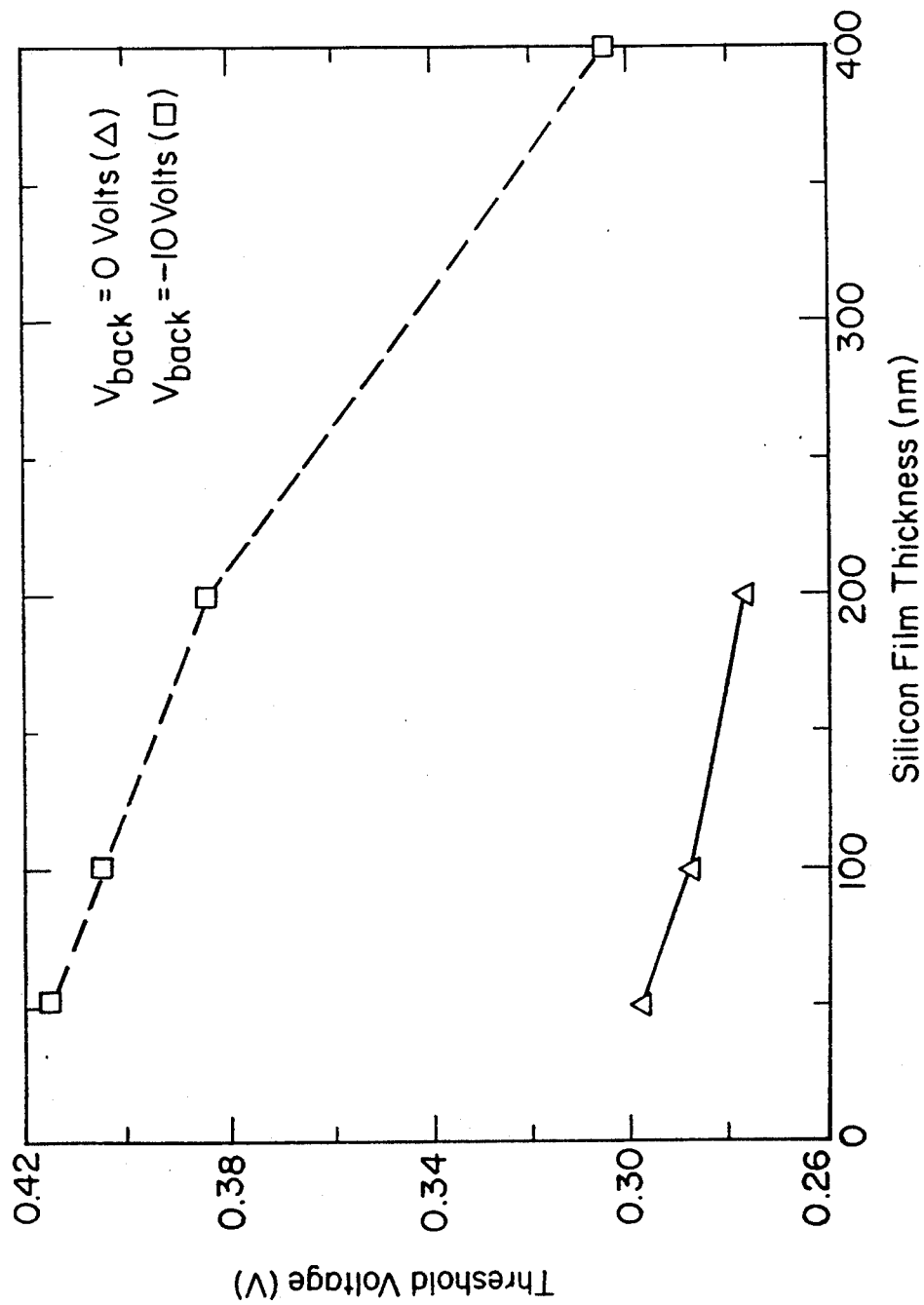
FIG. 5 is a plot of threshold voltage versus SOI film thicknesses for SOI MOSFETs supplied with different back-gate voltages.

The present invention provides devices with improved punch-through voltage characteristics. Punch-through voltage is defined as the drain voltage when the drain current, $I_d = 1$ nA/um with both source and gate held at ground. FIG. 2 shows the punch-through voltage for a device having a metallurgical channel length of 0.7 um as a function of SOI film thickness at back-gate biases $V_{back}$ of 0 and $-10$ Volts. Punch-through voltage decreases with increasing SOI film thickness because of the penetration of the drain electric field towards the source from the bottom of the semiconductor film. FIGS. 3(a) and 3(b) show the potential contours at $V_{ds} = 5$ and $V_{gs} = 0$ for 50-nm and 200-nm thick SOI NMOSFETs at $V_{back} = 0$ V. The penetration of the drain electric field towards the source is clearly evident in the 200-nm thick device. In the 50-nm thick device, the electric field in the channel is gate dominated. Without back-gate bias, SOI devices with film thicknesses less than about 90 nm are capable of sustaining 5 V power supply voltage. A back-gate bias of $-10$ V dramatically improves the punch-through voltage, which increases the usable film thickness to 270 nm for 5 V operation. This result is evident in FIG. 3(c) which shows that the drain electric field is pulled towards the back gate by the negative back gate bias. This leads to less penetration of the drain electric field into the back channel In studying the threshold voltage characteristics of the device, the conventional definition of threshold voltage $V_T$ is used; that is, the threshold voltage is the linearly extrapolated value at the $V_{gs}$ (gate voltage) axis in the $I_d$ versus $V_{gs}$ plot at small $V_{ds}$. The threshold voltages of SOI NMOSFET's at $V_{back} = 0$ V are shown in FIG. 4 as functions of metallurgical channel length for SOI film thicknesses of 50, 100, and 200(0) nm. In general, threshold voltage falls off with increasing film thickness or decreasing channel length, but the dependence is weak. For a channel length of 1.4 um the threshold voltage has the long channel value, 0.3 V, independent of film thickness used in the simulations. The threshold voltage of the 50-nm thick device remains nearly constant down to 0.7 um channel length. The reduction in threshold voltage with decreasing channel length is due to drain-induced barrier lowering (DIBL) as described by R. R. Troutman in *IEEE Trans. Electron Devices*, ED-26, 461 (1979). A similar explanation can be applied to the dependence of threshold voltage on SOI film thickness. FIG. 5 shows threshold voltages of SOI NMOSFET's with 0.7 um channel versus SOI film thickness for $V_{back} = V$ and $-10$ V. Although the short channel effect increases with film thickness, the dependence is fairly weak for devices having film thickness of less than 200 nm. The weak dependence of threshold voltage on device channel length and film thickness indicates that the device is relatively insensitive to process variations.

The threshold voltage for a PMOSFET with 50-nm thick SOI film and 0.7 um metallurgical channel length is $-0.48$ V, the long channel value. To balance the threshold voltages of n- and p-channel devices in a complementary circuit design, back-gate bias is applied to the substrate. With a $-10$ V back-gate bias applied to a 50-nm thick device, the threshold voltage changes from 0.298 V to 0.415 V for an n-channel device, and from $-0.48$ V to $-0.385$ V for a p-channel device. Proper selection of back-gate bias and/or buried insulator thickness will bring the threshold voltages to desirable values.

Figure 6:
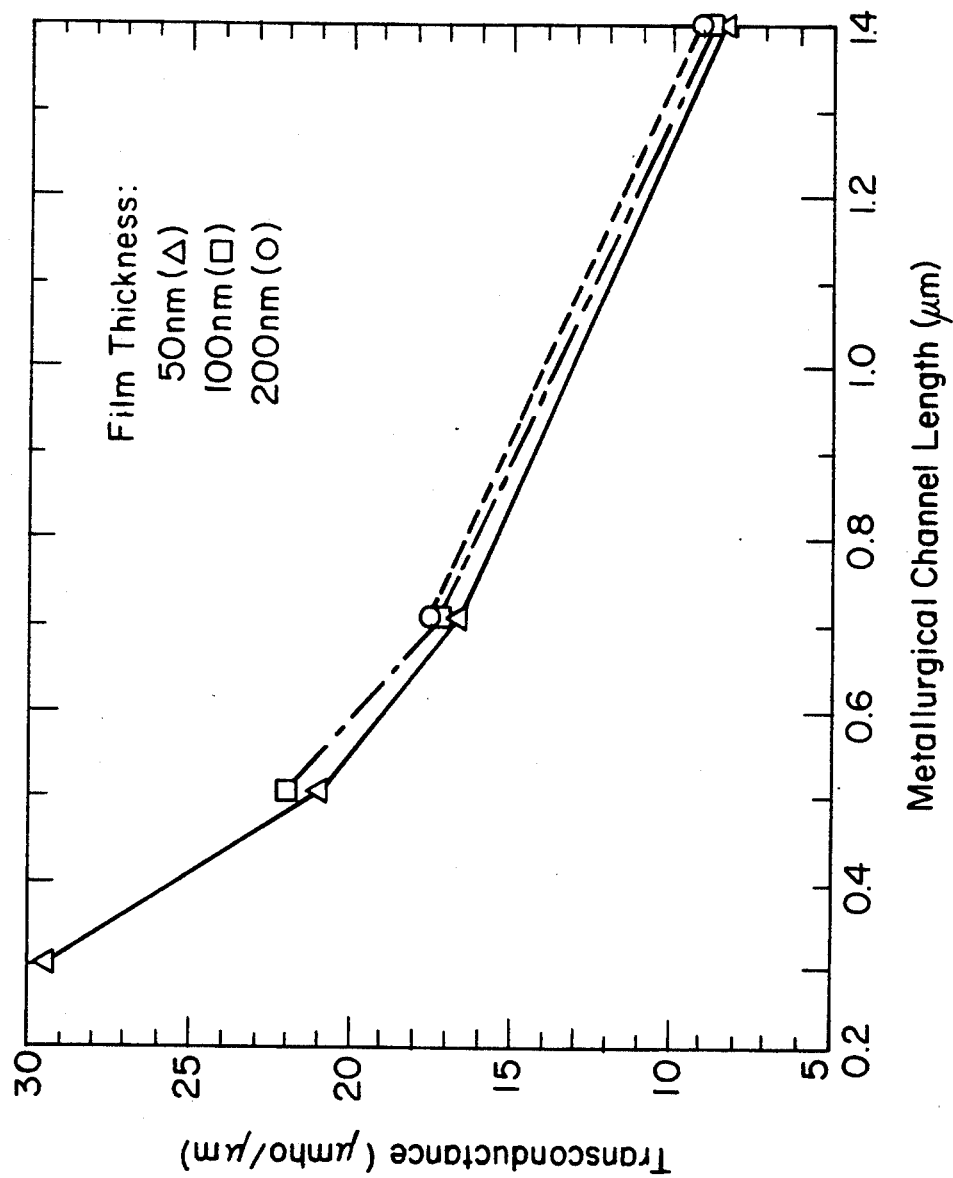
FIG. 6 is a plot of transconductance versus metallurgical channel length for SOI MOSFETs having three different thin-film thicknesses.
Figure 7:
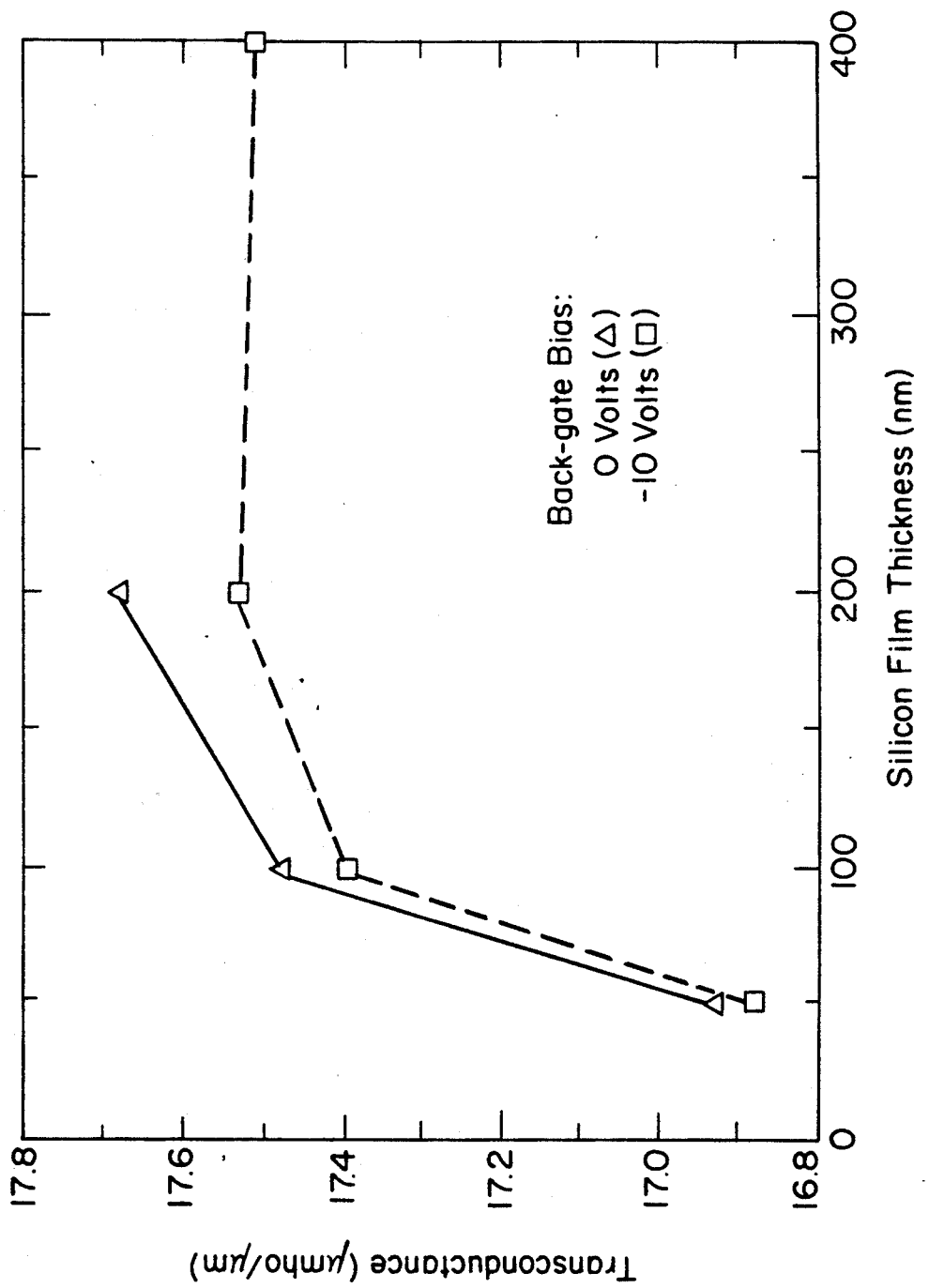
FIG. 7 is a plot of transconductance versus SOI film thicknesses for SOI MOSFETs supplied with different back-gate voltages.

Very high values of transconductance $g_m$ can also be obtained by the use of near-intrinsic semiconducting film and thin gate dielectric, as shown in FIG. 6. This figure shows the dependence of transconductance on metallurgical channel length for 50 nm, 100 nm and 200 nm SOI NMOSFET's at $V_{back} = 0$. FIG. 7 shows the transconductance of an SOI NMOSFET as a function of SOI film thickness at back-gate biases of 0 and $-10$ V. The transconductance increases with increasing SOI film thickness and starts to saturate at about 200 nm. Reduction of transconductance with negative back-gate bias is observed, and the reduction is less for thinner SOI devices than for thicker ones.

Figure 8:
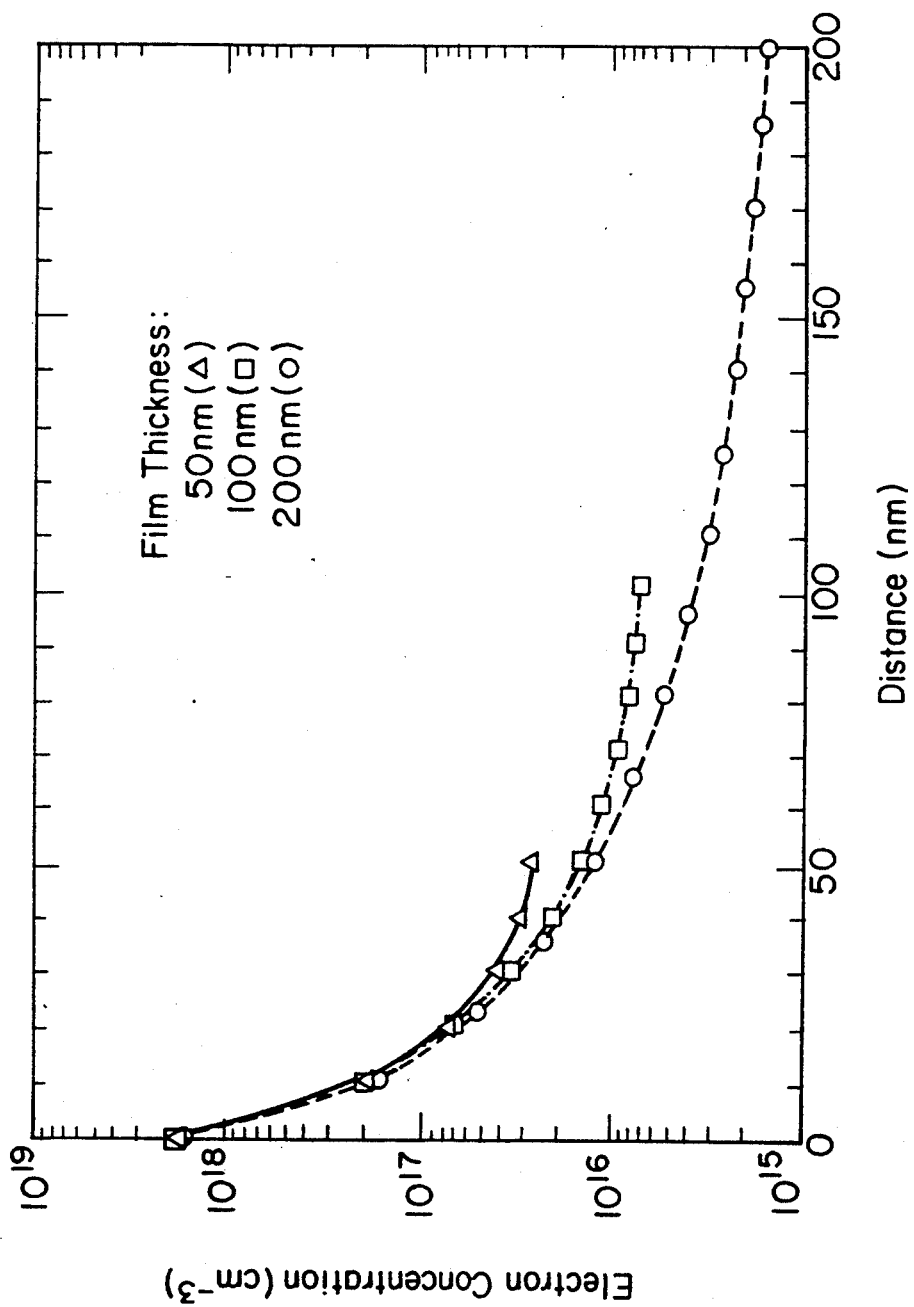
FIG. 8 is a plot of channel electron distribution for SOI MOSFETs having three different thin film thicknesses.

There are several explanations for the degradation of transconductance with decreasing SOI film thickness, including distribution of mobile charges, surface mobility degradation, field dependent mobility and source/drain series resistance. FIG. 8 shows the channel electron distribution after strong inversion ($V_{gs} = 1$ V) for SOI film thicknesses of 50, 100, and 200(0) nm. The surface concentration increases with decreasing thickness but the difference is very small. The total number of electrons calculated by integrating each curve is almost the same because the total amount of charge induced by the gate in each film is the same and the space charge is negligible. Since charge transport close to the surface is affected by surface scattering, a greater reduction of surface mobility and hence of transconductance might occur with decreasing film thickness. However, the change of transconductance due to surface mobility reduction is found to be small. The distribution of electrons in a near-intrinsic semiconductor film is relatively uniform when compared to that in a moderately doped bulk silicon device because of the absence of space charge. Therefore, the percentage of electron population close to the surface and affected by surface scattering is not great enough to significantly change the charge transport.

Figure 9:
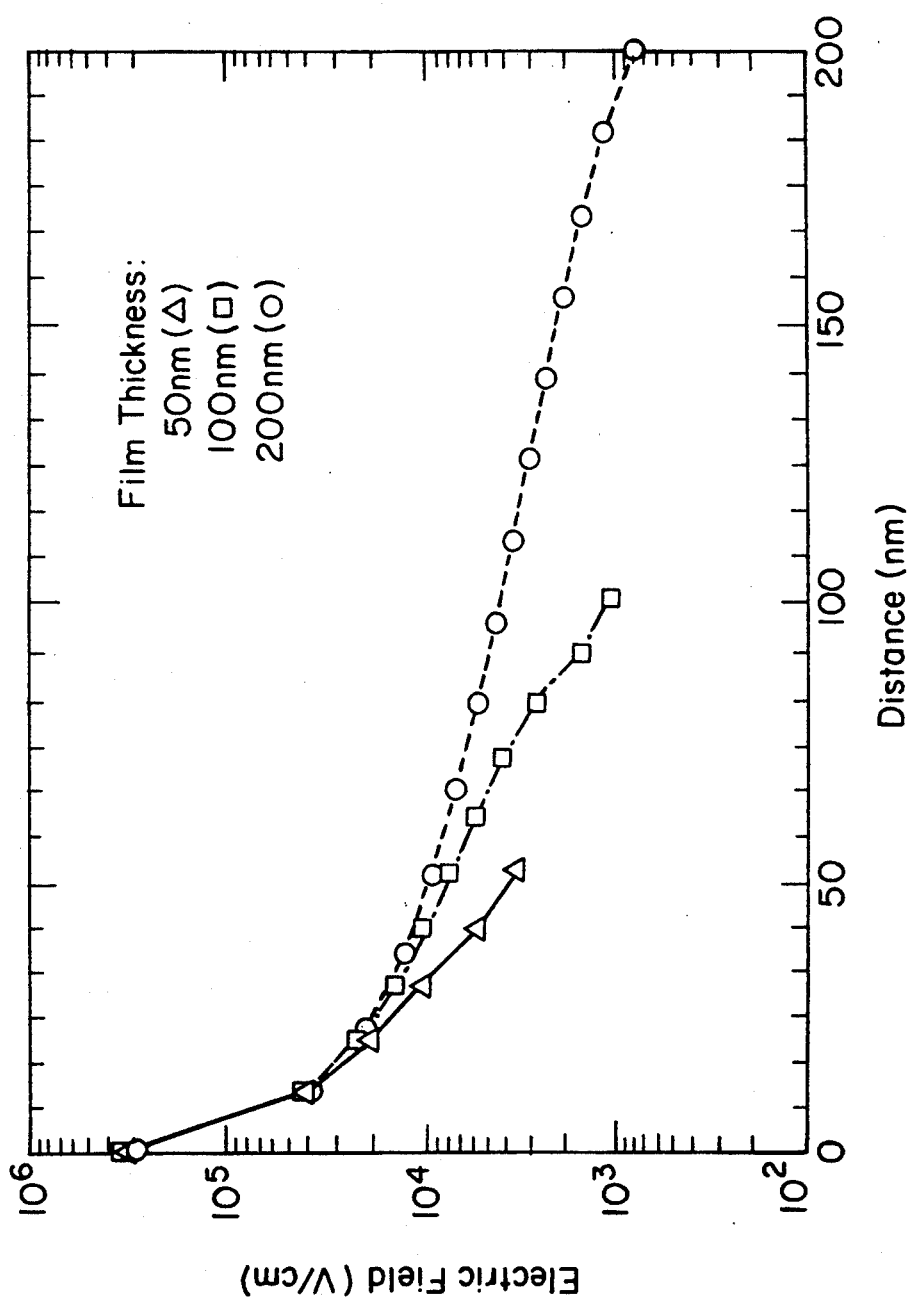
FIG. 9 is a plot of vertical electric field as a function of distance from the front interface for SOI MOSFETs having three different thin-film thicknesses.

FIG. 9 shows the electric field as a function of distance from the front interface after strong inversion at $V_{gs}=1$ V for film thicknesses of 50, 100, and 200 nm. The fields close to the front interface are very similar in the three different films but fall off more rapidly with distance as the thickness decreases. Next, the field mobility model was removed from the simulations. The transconductance value for each film increased but the difference between the three values did not change much, showing that this difference is not an electric field effect.

Figure 10:
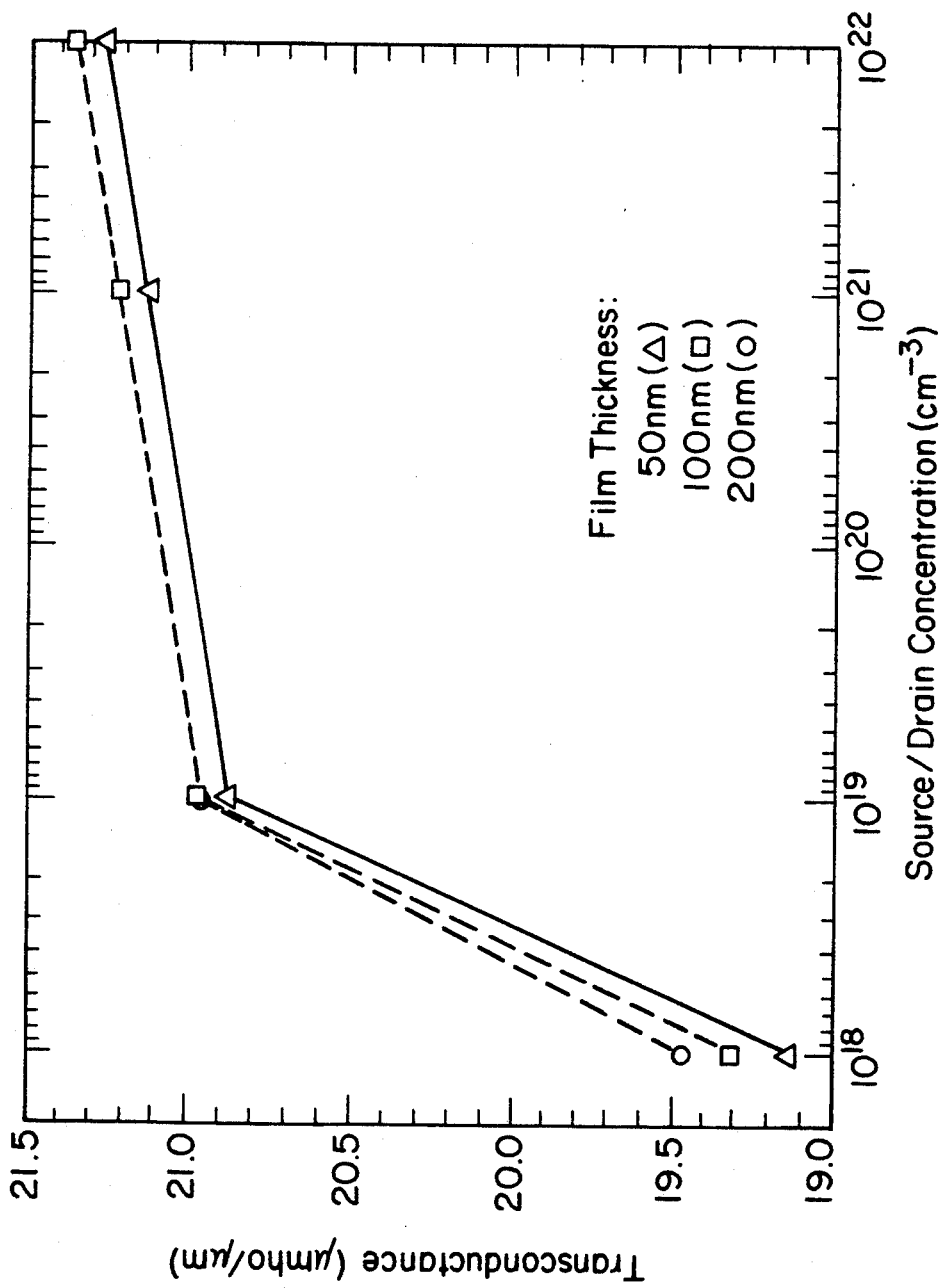
FIG. 10 is a plot of transconductance versus source-/drain impurity concentration for SOI MOSFETs having three different thin-film thicknesses.

Finally, a simplified device structure is assumed for the simulation to allow an examination of the influence of source/drain resistance on the transconductance. The device has a 0.8 um channel and abrupt junctions between the channel and uniformly doped source and drain regions (that is, there are no lateral diffusion regions with gradually changing dopant concentrations). FIG. 10 shows that the transconductance decreases significantly in 50, 100, and 200 nm SOI NMOSFET's as the source/drain impurity concentration is reduced to less than $10^{19}$ cm$^{-3}$. The decrease becomes greater as the film thickness decreases. This suggests that the reduction of transconductance with decreasing SOI film thickness shown in FIG. 7 is due to source/drain resistance, since it is believed that the major contributor to the source/drain resistance is the 0.3 um lateral diffusion region assumed in the simulations. The small difference (0.4%) in transconductance shown in FIG. 10 between the 50-nm film and the 100-nm and 200-nm films at source/drain concentrations greater than $10^{19}$ cm$^{-3}$ is an effect of field dependent mobility.

Figure 11:
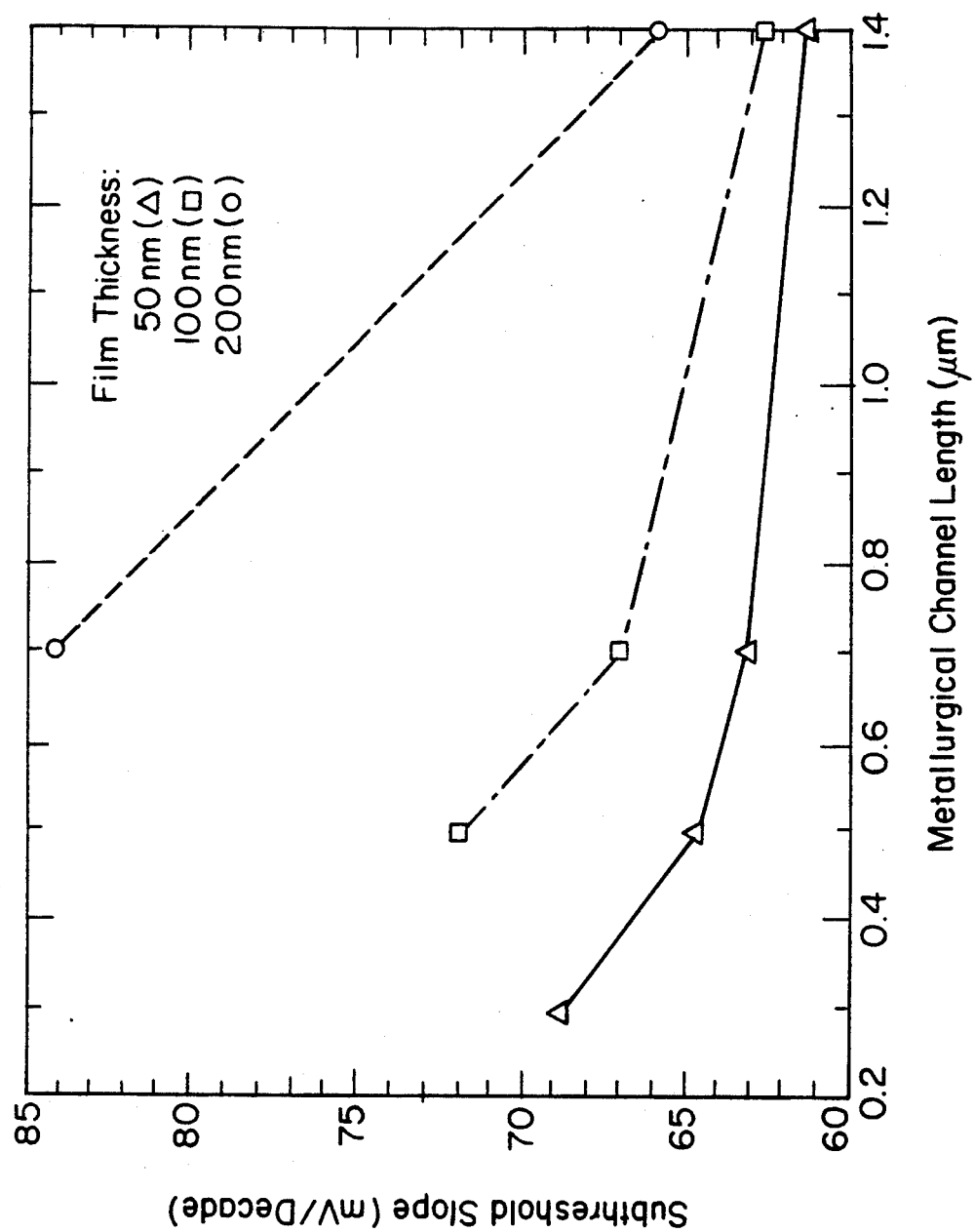
FIG. 11 is a plot of subthreshold slope versus metallurgical channel length for SOI MOSFETs having three different thin-film thicknesses.
Figure 12:
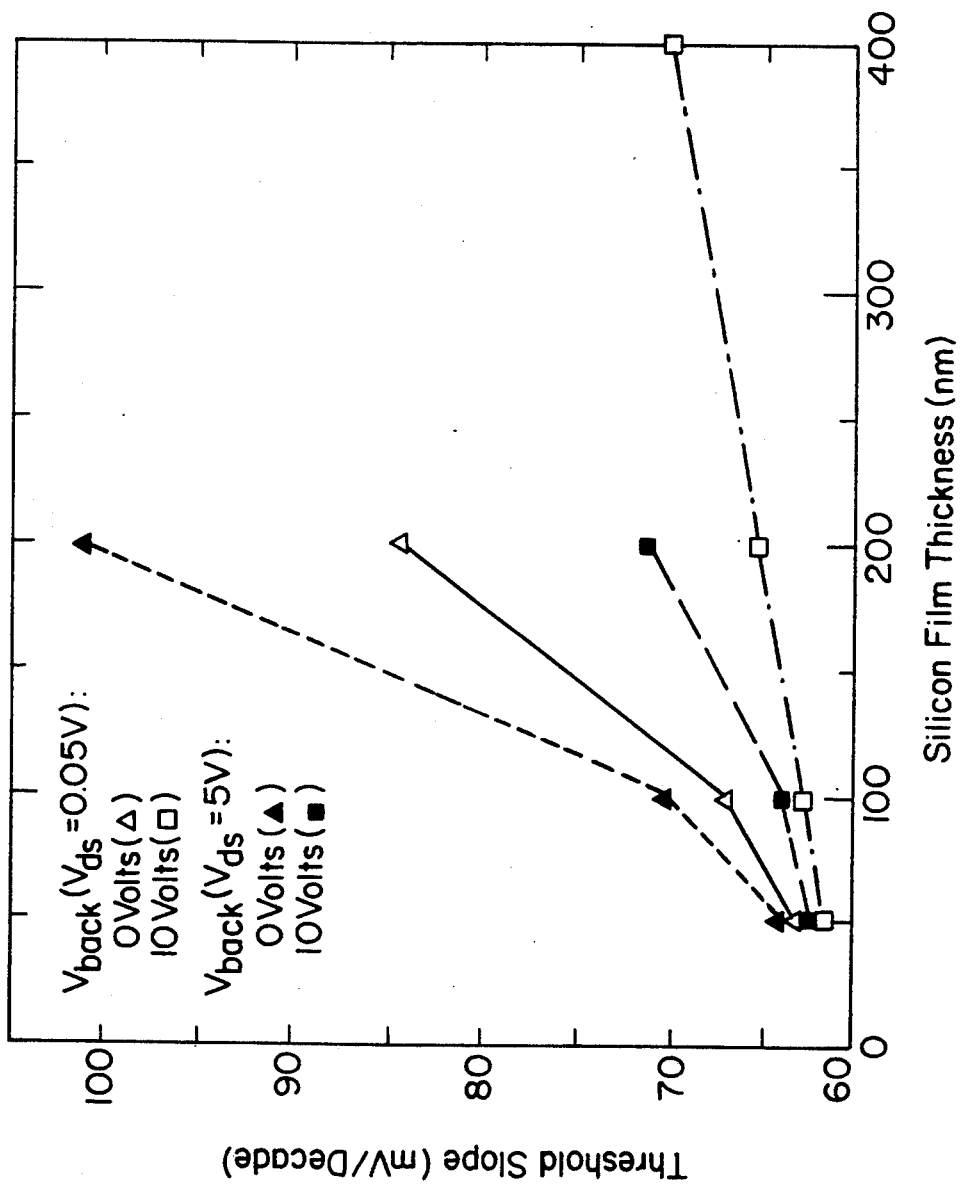
FIG. 12 is a plot of the subthreshold slope of 0.7 um SOI MOSFETs versus SOI film thickness for four different combinations of drain voltage and back-gate voltage.

In a fully depleted thin-film SOI MOSFET, the subthreshold slope, S, approaches the theoretical limit of 60 mV/decade ($S = \ln 10 \times kT/q$) if the interface state densities at the front and back Si/SiO$_2$ interfaces are negligible. This has been described by J.-P. Colinge in *IEEE Electron Device Lett.*, EDL-9, 97 (1988). FIG. 11 shows the subthreshold slope as a function of metallurgical channel length for SOI film thicknesses of 50, 100 and 200 nm. The subthreshold slope of a 1.4 um device on a 50-nm thick SOI film is 61.4 mV/decade, which is very close to the theoretical limit. As a result of drain induced barrier lowering (DIBL) the subthreshold slope increases with decreasing channel length or increasing SOI film thickness. The subthreshold slope also increases with drain voltage, but the increase is small for very thin SOI films. This can be seen in FIG. 12 which plots the dependence of subthreshold slope for a 0.7 um SOI NMOSFET at: $V_{ds}=0.05$ V and $V_{back}=0$ V, $V_{ds}=0.05$ V and $V_{back}=10$ V, $V_{ds}=5$ V and $V_{back}=0$ V and $V_{ds}=5$ V and $V_{back}=-10$ V. Since DIBL can be suppressed by a negative back gate bias, such a bias decreases the subthreshold slope, as shown in FIG. 12. The improvement becomes more pronounced for thicker SOI films.

Device parameters of a 50-nm thick SOI NMOSFET and its bulk Si counterpart are compared in Table 1.

TABLE 1

| Comparison of NMOSFET Device Parameters | | | |
|---|---|---|---|
| | Doping (cm$^{-3}$) | V$_T$ (V) | g$_m$ (umho/um) | S (mV/dec) |
| SOI (50 nm) | 1 × 10$^{14}$ | 0.30 | 8.54 | 61.4 |

TABLE 1-continued

| Comparison of NMOSFET Device Parameters | | | |
|---|---|---|---|
| | Doping (cm$^{-3}$) | V$_T$ (V) | g$_m$ (umho/um) | S (mV/dec) |
| Bulk Si | 8 × 10$^{16}$ | 0.33 | 4.85 | 76.8 |

For both devices the metallurgical channel length is 1.4 um and the gate dielectric thickness is 10 nm. The gate material is tungsten for the SOI device and n+ polysilicon for the bulk Si device. The SOI device has a 76% greater transconductance and a 20% lower subthreshold slope. Carrier mobilities, and hence device transconductance, are enhanced dramatically in near-intrinsic SOI films because of a large reduction in charged impurity scattering, surface scattering and electric field effect. In a moderately doped bulk Si device, the inversion layer is very narrow (less than 10 nm) and free carriers are squeezed to the surface region, where the electric field is strong. The relatively uniform distribution of free carriers in a near-intrinsic SOI film make it less sensitive to surface scattering and the field dependent mobility effect. Although an impurity concentration of 10$^{-}$cm$^{-3}$ has been assumed for the near-intrinsic SOI films described herein, simulations indicate that there is no significant change in device parameters as long as the doping concentration in the channel region remains below 10$^{15}$ cm$^{-3}$.

Figure 13:
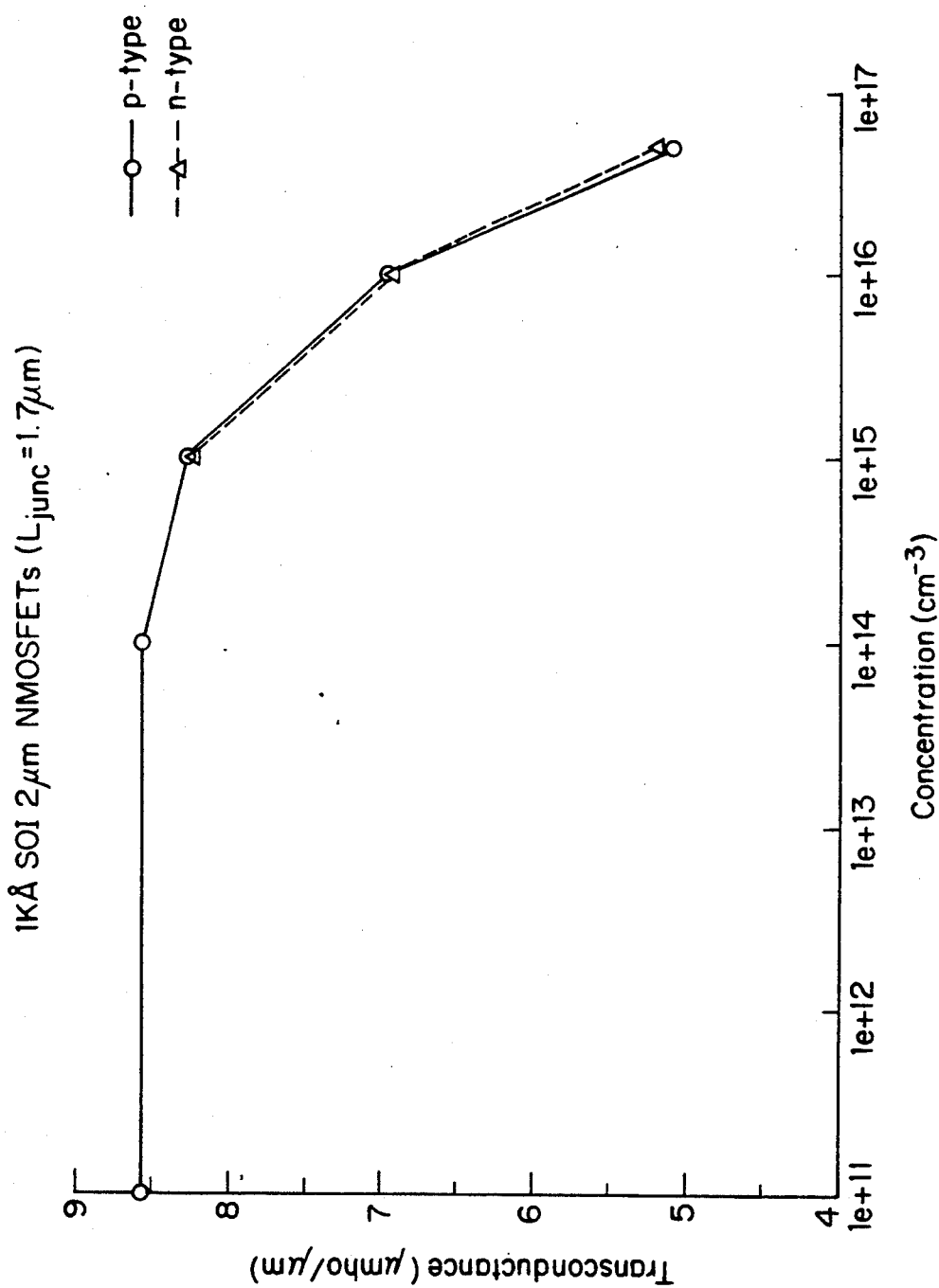
FIG. 13 is a plot of transconductance versus p- and n-type channel doping concentration for SOI MOSFETs.
Figure 14:
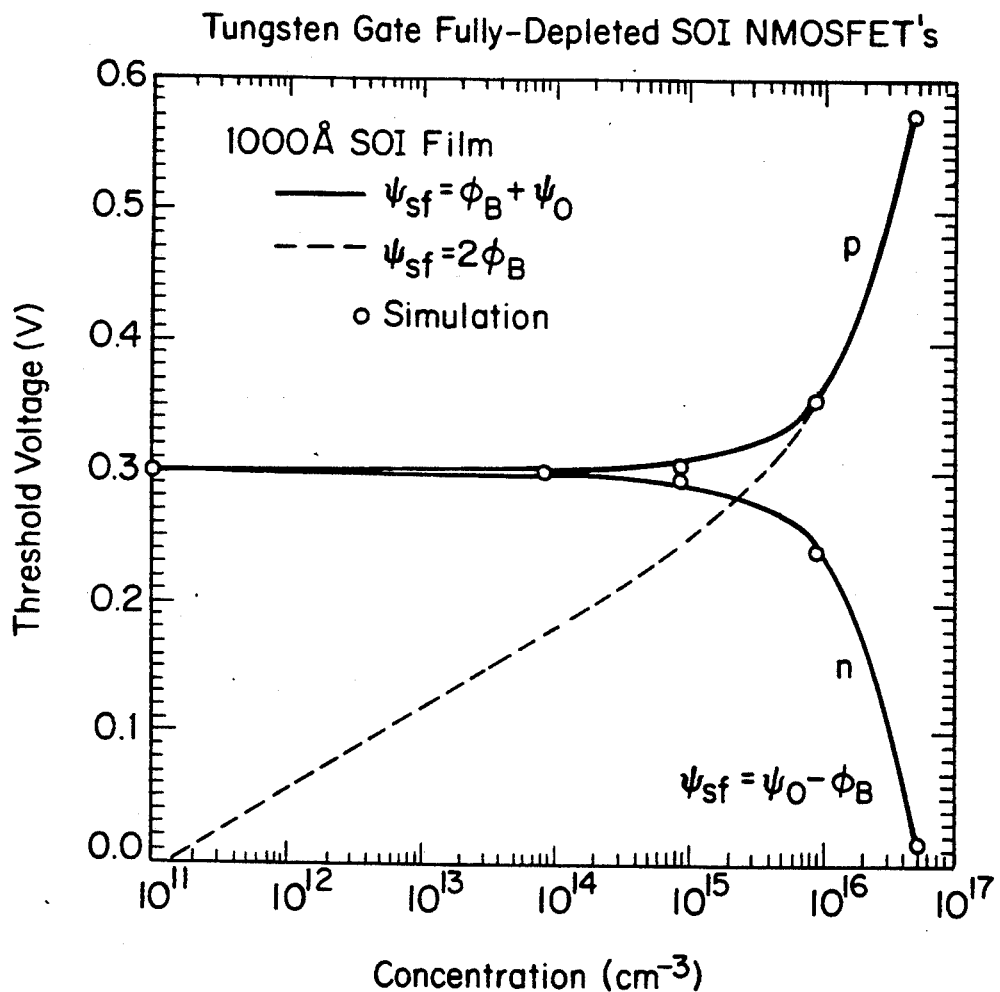
FIG. 14 is a plot of front gate threshold voltage versus p- and n-type channel doping concentration for SOI MOSFETs.
Figure 15:
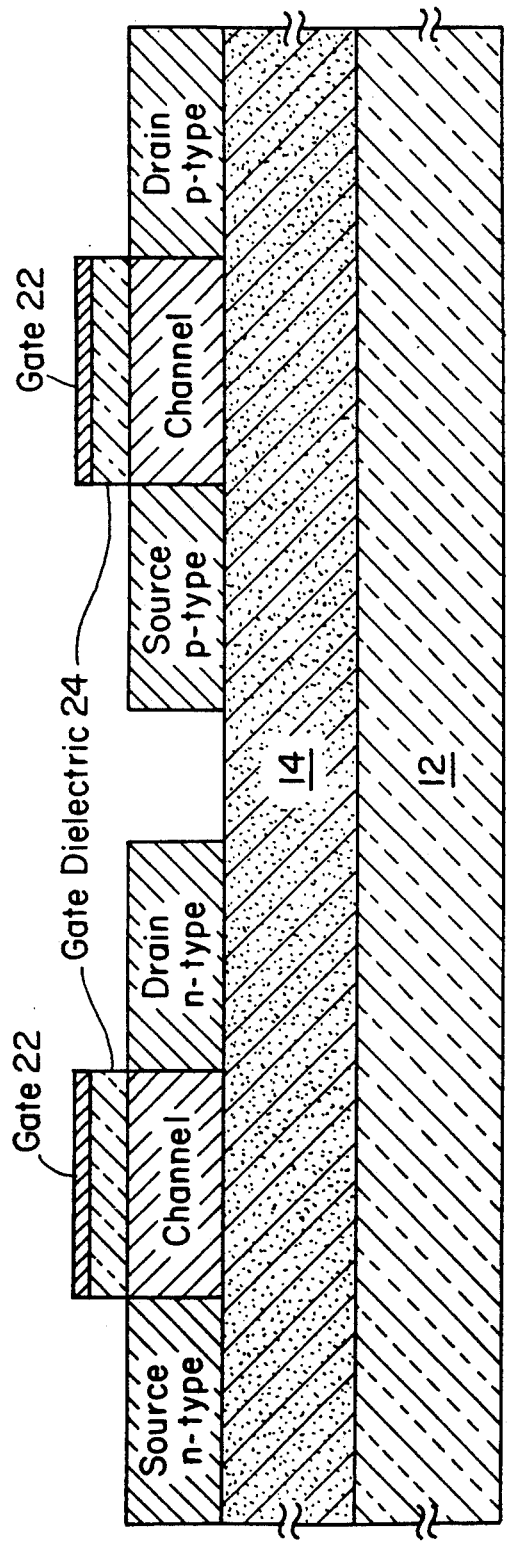
FIG. 15 is a cross sectional view of a complementary device of the present invention.

This can be clearly seen in FIG. 13 in which front-gate transconductance is plotted against p-type and n-type channel doping concentration for 100-nm-thick SOI NMOSFET's having 1.7 micron channel lengths at zero back-gate bias. The effects of channel doping can also be seen in FIG. 14 in which front gate threshold voltage is plotted against p-type and n-type channel doping concentration for 100-nm thick SOI NMOSFET's having 1.7 micron channel lengths at zero back gate bias. The dashed line illustrates the prior art model of Lim and Fossum described earlier in the specification in which the front-surface potential is equated with twice the Fermi potential of the semiconductor film. In contrast, the present device exhibits a threshold voltage in the near intrinsic region that is identical or nearly identical whether the channel region is n-type or p-type. Note that a PMOSFET device can be illustrated in the same manner as FIG. 14 where the threshold voltage is negative and the dashed line would overlap the n-type doping curve above the near-intrinsic doping level. The critical surface carrier concentration, n$_T$, required to turn on the device is determined to be 1.09 × 10$^{16}$ cm$^{-3}$ which corresponds to a $\psi_O$ of 0.35 V.

Industrial Applicability

The near-intrinsic thin-film silicon-on-insulator complementary FET devices described herein are believed to have wide applicability in VLSI and ULSI circuits. The weak dependence of threshold voltage on channel length and SOI film thickness indicates that short channel effects and process variations will have little effect on device performance. This is evidenced by simulations in which the threshold voltages of FET's having thin-film thickness of 50 nm has been found to remain fairly constant down to channel lengths of approximately 0.5 um. In addition, threshold voltages of 0.3 V for n-channel devices and −0.48 V for p-channel devices are expected for zero back-gate bias when a tungsten gate is used. These values can be tuned to meet specific performance requirements by proper selection of back-gate bias and/or buried insulator thickness if a conducting or semiconducting substrate is used. In the thin SOI devices described herein, punch-through is completely suppressed or significantly improved by adjusting the back-gate bias to pull the drain electric field toward the back gate.

The device transconductance has been found to be directly dependent on SOI film thickness, reaching a saturation point at a film thickness of about 200 um. The source/drain resistance of the device appears to be the limiting factor for transconductance. In long channel devices having a very thin SOI film thickness, subthreshold slopes approaching the theoretical value of 60 mV/decade have been simulated. Drain induced barrier lowering has been found to degrade subthreshold behavior in short channel or relatively thick SOI devices, however, this effect can be suppressed using a back-gate bias. This back gate bias does, however, effect the device characteristics as a result of charge coupling between the front and back gates.

To improve punch-through voltage and subthreshold behavior, a negative back-gate bias is required for NFET's and a positive back-gate bias is required for PFET's. Thus, back-gate biasing has to be properly adjusted to balance the NFET's and the PFET's in complementary circuits.

The simulations described herein indicate that submicrometer FET's having near-intrinsic thin SOI films, gate materials having work functions which place their Fermi levels at approximately the middle of the band gap of the thin-film semiconductor material, and appropriate back-gate biasing have enhanced performance characteristics over their bulk Si counterparts in complementary circuits. Specifically, these simulations have indicated that the devices will have significantly higher transconductance and punch-through voltage and lower subthreshold slope and will be easier to fine tune to optimum performance.

Equivalents

Those skilled in the art will recognize or be able to ascertain, using no more than routine experimentation, many equivalents to the specific embodiments of the invention described herein. Such equivalents are intended to be encompassed by the following claims.

I claim:

1. A field effect transistor device which comprises:
   a) an insulating layer;
   b) a substantially single crystal semiconducting film upon said insulating layer, said semiconducting film having a thickness of less than about 0.5 um in regions defining device channels, the film in said channel regions having a doping concentration of less than about $10^{16}$ cm$^{-3}$, said film further defining source and drain regions having an impurity concentration higher than that of the channel regions;
   c) a gate dielectric upon the channel regions; and,
   d) a gate material upon the gate dielectric, said gate material having a work function such that the gate material has a Fermi level that is positioned at about the middle of the bandgap of the semiconducting film of the channel regions.

2. A field effect transistor as in claim 1 additionally comprising a substrate below the insulating layer.

3. A field effect transistor device as in claim 2 wherein the substrate comprises a semiconductor material.

4. A field effect transistor device as in claim 3 wherein the substrate comprises silicon.

5. A field effect transistor device as in claim 3 wherein the substrate comprises gallium arsenide.

6. A field effect transistor device as in claim 2 wherein the substrate comprises an insulating material.

7. A field effect transistor device as in claim 2 wherein the substrate comprises a conducting material.

8. A field effect transistor device as in claim 1 wherein the insulating layer comprises a material selected from the group consisting of insulating oxides, insulating nitrides and mixtures thereof.

9. A field effect transistor device as in claim 8 wherein the insulating layer comprises $SiO_2$.

10. A field effect transistor device as in claim 1 wherein the semiconducting film comprises silicon.

11. A field effect transistor device as in claim 1 wherein the semiconducting film comprises gallium arsenide.

12. A field effect transistor device as in claim 1 wherein the semiconducting film has a thickness of approximately 0.25 um.

13. A field effect transistor device as in claim 1 wherein the doping concentration in the channel regions is below about $10^{15}$ cm$^{-3}$.

14. A field effect transistor device as in claim 1 wherein the gate dielectric comprises a material selected from the group consisting of insulating oxides, insulating nitrides and mixtures thereof.

15. A field effect transistor device as in claim 14 wherein the gate dielectric comprises $SiO_2$.

16. A field effect transistor device as in claim 10 wherein the gate material has a work function of between about 4.4 and about 5.0 eV.

17. A field effect transistor device as in claim 16 wherein the gate material is selected from the group consisting of refractory metals and silicides thereof.

18. A field effect transistor device as in claim 10 wherein the gate material comprises tungsten.

19. A field effect transistor device as in claim 10 wherein the gate material comprises tungsten silicide.

20. A field effect transistor device as in claim 10 wherein the gate material comprises molybdenum.

21. A field effect transistor device as in claim 10 wherein the gate material comprises molybdenum silicide.

22. A field effect transistor device which comprises:
   a) a silicon substrate;
   b) an oxide layer upon the substrate;
   c) a substantially single crystal silicon film upon the oxide layer, said silicon film having a thickness of less than about 0.5 um in areas defining device channel regions, the film in said channel regions having a doping concentration of less than about $10^{16}$ cm$^{-3}$, said film further defining source and drain regions having an impurity concentration higher than that of the channel regions;
   d) a gate oxide upon the channel regions; and
   e) a gate material upon the gate oxide and positioned over the channel regions, said gate material having a work function of between about 4.4 and about 5.0 eV such that the gate material has a Fermi level positioned at about the middle of the bandgap of the silicon channel region.

23. A field effect transistor device as in claim 22 wherein the silicon film has a thickness of less than about 0.25 um.

24. A field effect transistor device as in claim 22 wherein the doping concentration in the channel regions is below about $10^{15}$ cm$^{-3}$.

25. A field effect transistor device as in claim 22 wherein the gate material comprises tungsten.

26. In a near intrinsic, thin-film, semiconductor-on-insulator, field effect transistor characterized by having a substrate, a buried insulating layer, a near-intrinsic semiconductor film layer having a doping concentration of less than about $10^{16}$ cm$^{-3}$, a gate material upon a gate dielectric extending over the layer, the layer being patterned to define source, drain and channel regions;

the improvement which comprises, as the gate material, a material having a work function which approximates its Fermi level to the middle of the bandgap of the semiconductor film material wherein the film comprises a single crystal epitaxial layer.

27. The improvement of claim 26 wherein the semiconductor film material comprises silicon.

28. The improvement of claim 27 wherein the gate material has a work function of between about 4.4 and about 5.0 eV.

29. The improvement of claim 28 wherein the gate material is selected from the group consisting of refractory metals and silicides thereof.

30. The improvement of claim 27 wherein the gate material comprises tungsten.

31. The improvement of claim 26 wherein the semiconductor film material comprises gallium arsenide.

32. A complementary insulated gate field effect transistor circuit having both n-type and p-type transistors in which each transistor comprises:
a) an insulating layer;
b) a single crystal semiconducting film upon said insulating layer, said semiconducting film having a thickness of less than about 0.5 um in regions defining device channels, the film in said channel regions having a doping concentration of less than about $10^{16}$ cm$^{-3}$, said film further defining source and drain regions having an impurity concentration higher than that of the channel regions;
c) a gate dielectric upon the channel regions; and
d) a gate material upon the gate dielectric, the same gate material extending over the channel regions in both n-type and p-type transistors of the circuit, said gate material having a work function which approximates its Fermi level to the middle of the bandgap of the channel semiconductor material.

33. The circuit of claim 32 wherein the semiconductor film comprises silicon.

34. The circuit of claim 33 wherein the gate material comprises tungsten.

35. The circuit of claim 32 wherein the transistor channel regions of the n-type and p-type transistors are each doped with the same type of dopant.

36. The circuit of claim 35 wherein each transistor has an n-type channel doping.

37. The complementary insulated gate field effect transistor circuit of claim 32 wherein the threshold voltage is substantially the same for either p-type or n-type channel regions for each transistor.

38. The field effect transistor device of claim 1 wherein at least a portion of the semiconducting film comprises an epitaxial region.

39. The field effect transistor device of claim 1 wherein the film comprises silicon and the gate material has a work function between 4.4 and 5.0 eV.

40. The field effect transistor device of claim 1 wherein the device comprises an n-channel transistor with a threshold voltage under 0.3 Volts with no back-gate bias.

* * * * *